(12) United States Patent
Kim et al.

(10) Patent No.: US 11,769,732 B2
(45) Date of Patent: Sep. 26, 2023

(54) INTEGRATED CIRCUIT (IC) WITH RECONSTITUTED DIE INTERPOSER FOR IMPROVED CONNECTIVITY, AND RELATED METHODS OF FABRICATION

(71) Applicant: QUALCOMM Incorporated, San Diego, CA (US)

(72) Inventors: Jonghae Kim, San Diego, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 86 days.

(21) Appl. No.: 17/024,214

(22) Filed: Sep. 17, 2020

(65) Prior Publication Data
US 2022/0084947 A1 Mar. 17, 2022

(51) Int. Cl.
*H01L 23/538* (2006.01)

(52) U.S. Cl.
CPC ...... *H01L 23/5384* (2013.01); *H01L 23/5385* (2013.01); *H01L 23/5386* (2013.01)

(58) Field of Classification Search
CPC ............. H01L 23/5384; H01L 23/5385; H01L 23/5386
See application file for complete search history.

(56) References Cited

U.S. PATENT DOCUMENTS

| | | | | |
|---|---|---|---|---|
| 2013/0159587 A1* | 6/2013 | Nygren | ................... | G11C 5/063 710/306 |
| 2016/0172302 A1* | 6/2016 | Song | ................... | H01L 23/5386 438/109 |
| 2017/0148737 A1* | 5/2017 | Fasano | ................... | H01L 25/18 |
| 2018/0102469 A1* | 4/2018 | Das | ................... | H01L 24/06 |
| 2018/0284186 A1* | 10/2018 | Chadha | ............... | H01L 23/5385 |
| 2019/0238134 A1* | 8/2019 | Lee | ................... | H03K 19/1737 |
| 2020/0006235 A1 | 1/2020 | Aleksov et al. | | |
| 2020/0161266 A1* | 5/2020 | Shim | ................... | H01L 23/147 |
| 2020/0227377 A1* | 7/2020 | Liff | ................... | H01L 21/6835 |
| 2021/0074645 A1* | 3/2021 | Tsai | ................... | H01L 25/50 |

OTHER PUBLICATIONS

Samal S., et al., "Monolithic 3D IC vs. TSV-based 3D IC in 14nm FinFET Technology", 2016, 2 Pages.
Invitation to Pay Additional Fees and Partial International Search for International Patent Application No. PCT/US2021/046323, dated Dec. 13, 2021, 14 pages.
International Search Report and Written Opinion for International Patent Application No. PCT/US2021/046323, dated Feb. 3, 2022, 20 pages.

* cited by examiner

*Primary Examiner* — Fernando L Toledo
*Assistant Examiner* — Neil R Prasad
(74) *Attorney, Agent, or Firm* — Withrow & Terranova, PLLC

(57) ABSTRACT

An integrated circuit (IC) with reconstituted die interposer for improved connectivity has at least one device or component mounted on an exterior upper surface that couples to a die in an interposer layer within the package. The interposer layer may have interconnect structures, where a first interconnect structure has vias of a first pitch and a second interconnect structure has vias of a second pitch greater than the first pitch. In this manner, the interposer layer acts as a device that can allow conductive coupling for other devices with those pitches to support interconnections between those devices and other devices within the interposer layer.

20 Claims, 10 Drawing Sheets

INTEGRATED CIRCUIT (IC) WITH RECONSTITUTED DIE INTERPOSER FOR IMPROVED CONNECTIVITY, AND RELATED METHODS OF FABRICATION

BACKGROUND

I. Field of the Disclosure

The technology of the disclosure relates generally to packages that may contain one or more dies in an interior layer and one or more devices on an exterior layer and ways to provide connections therebetween.

II. Background

Integrated circuits (ICs) are the cornerstone of electronic devices. ICs are packaged in an IC package, also called a "semiconductor package" or "chip package." The IC package includes one or more semiconductor dice as an IC(s) that are mounted on and electrically coupled to a package substrate to provide physical support and an electrical interface to the semiconductor die(s). The package substrate may be an embedded trace substrate (ETS), for example, that includes embedded electrical traces in one or more dielectric layers and vertical interconnect accesses (vias) coupling the electrical traces together to provide electrical interfaces between the semiconductor die(s). The semiconductor die(s) is mounted to and electrically interfaced to interconnects exposed from a metallization structure (e.g., a package substrate). The semiconductor die(s) and metallization structure are encapsulated in a package material, such as a molding compound, to form the IC package. The IC package may also include external solder balls in a ball grid array (BGA) that are electrically coupled to interconnects exposed in a bottom layer of the package substrate to couple electrically the solder balls to the electrical traces in the package substrate. The solder balls are electrically coupled to metal contacts on a printed circuit board (PCB) when the IC package is mounted to the PCB to provide an electrical interface between electrical traces in the PCB to the IC chip through the package substrate in the IC package.

As devices continue to shrink while concurrently providing more functionality, there is a desire to also shrink the size of IC packages. This can cause challenges in providing interconnects between devices in an IC package.

SUMMARY OF THE DISCLOSURE

Aspects disclosed in the detailed description include an integrated circuit (IC) with reconstituted die interposer for improved connectivity and related methods of fabrication. In an exemplary aspect, an IC package has at least one device or component mounted on an exterior upper surface that couples to a die in an interposer layer within the package. The interposer layer may have interconnect structures, where a first interconnect structure has vias of a first pitch and a second interconnect structure has vias of a second pitch greater than the first pitch. In this manner, the interposer layer acts as a device that can allow conductive coupling for other devices with those pitches to support interconnections between those devices and other devices within the interposer layer.

In an exemplary aspect, the external device may be a high-bandwidth memory device having multiple thousands of input-output contacts, and the interconnect device includes vias in sufficient numbers to connect to these input-output contacts to metal layers in a metallization layer. There may be a second device mounted on the exterior upper surface. For example, the second device may be a low-power dual data rate (LPDDR) memory element, which may have a few hundred input-output contacts. A second interconnect device within the interposer layer may have vias at a larger pitch (i.e., spaced further apart) that handles the lower number of input-output contacts for the LPDDR memory element.

In this regard in one aspect, an integrated circuit (IC) package is disclosed. The IC package includes an interposer layer. The interposer layer includes a first interconnect structure including a first plurality of vias having a first pitch. The interposer layer also includes a second interconnect structure including a second plurality of vias having a second pitch greater than the first pitch.

In another aspect, an IC package is disclosed. The IC package includes an interposer layer. The interposer layer includes at least one IC die. The interposer layer also includes a first interconnect structure including a first plurality of vias having a first L/S value of less than or approximately is 0.7/0.7 micrometers (μm). The IC package also includes a component disposed adjacent to the interposer layer and coupled to the at least one IC die through the first interconnect structure.

In another aspect, a method of fabricating an IC package is disclosed. The method includes forming a metallization layer comprising a first side and a second side. The method also includes forming an interposer layer adjacent to the first side of the metallization layer. The interposer layer includes at least one IC die. The interposer layer also includes a first interconnect structure including a first plurality of vias having a first pitch. The interposer layer also includes a second interconnect structure including a second plurality of vias having a second pitch. The second pitch is greater than the first pitch. The method also includes forming a component adjacent to the interposer layer and connected to the at least one IC die through the first interconnect structure.

DETAILED DESCRIPTION

Figure 1:
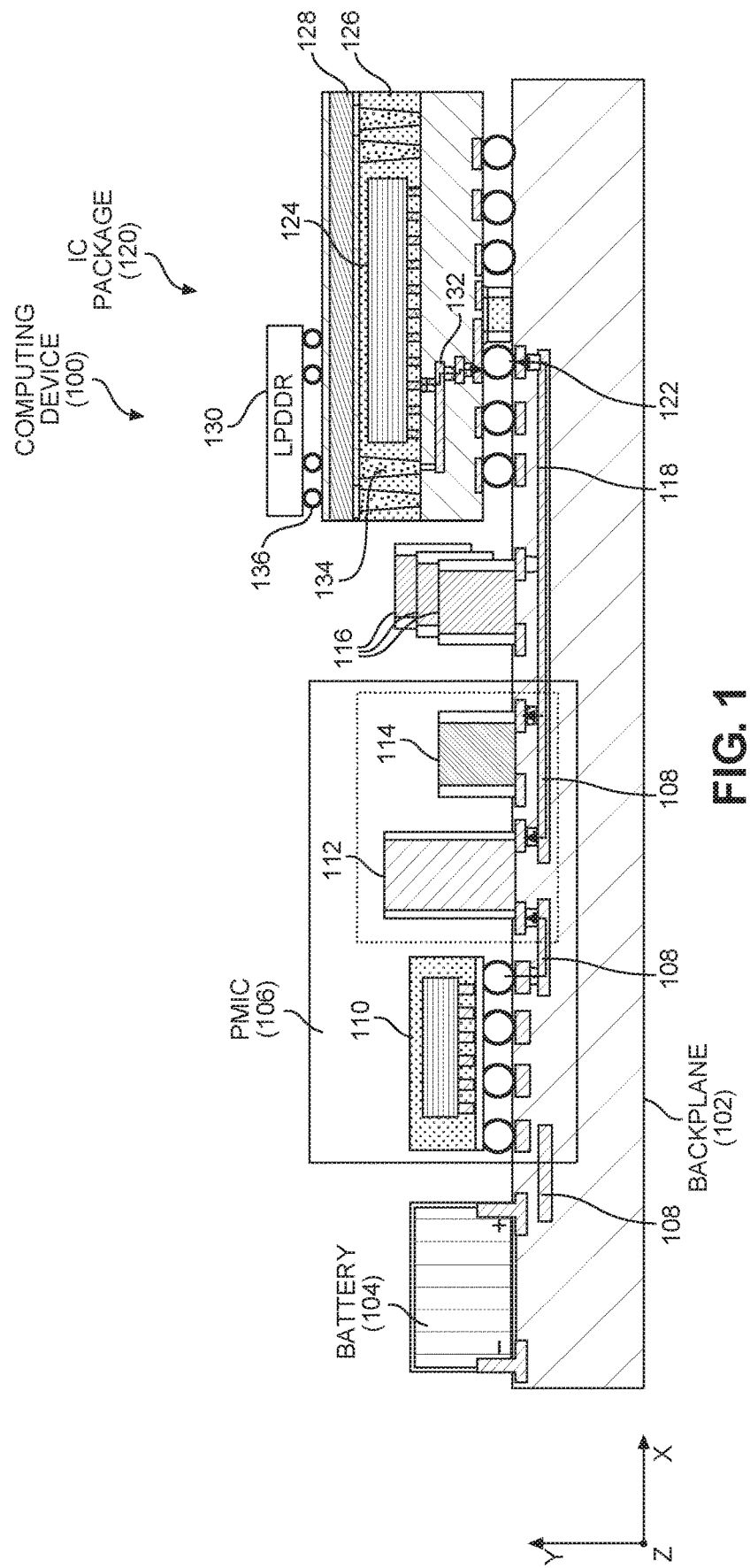
FIG. 1 is a side elevational view of an exemplary printed circuit board (PCB) for a computing device showing a variety of components on the PCB.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include an integrated circuit (IC) with reconstituted die interposer for improved connectivity and related methods of fabrication. In an exemplary aspect, an IC package has at least one device or component mounted on an exterior upper surface that couples to a die in an interposer layer within the package. The interposer layer may have interconnect structures, where a first interconnect structure has vias of a first pitch and a second interconnect structure has vias of a second pitch greater than the first pitch. In this manner, the interposer layer acts as a device that can allow conductive coupling for other devices with those pitches to support interconnections between those devices and other devices within the interposer layer.

In an exemplary aspect, the external device may be a high-bandwidth memory device having multiple thousands of input-output contacts, and the interconnect device includes vias in sufficient numbers to connect to these input-output contacts to metal layers in a metallization layer. There may be a second device mounted on the exterior upper surface. For example, the second device may be a low-power dual data rate (LPDDR) memory element, which may have a few hundred input-output contacts. A second interconnect device within the interposer layer may have vias at a larger pitch (i.e., spaced further apart) that handles the lower number of input-output contacts for the LPDDR memory element. Before discussing examples of IC packages having an IC with reconstituted die interposer having a plurality of interconnect structures having vias with different pitches that provides interconnections between devices or components that may have different pin and connection requirements starting at FIG. 2, a computing device having an IC package is first described in FIG. 1 below.

In this regard, FIG. 1 is a diagram of a computing device 100 having a backplane 102 with a variety of elements thereon. In particular, a battery 104 may be positioned on (or above in the Y-axis direction) the backplane 102 and coupled to a power management integrated circuit (IC) (PMIC) 106 via internal metal lines 108. The PMIC 106 may include a switched mode power supply circuit 110 and one or more inductors 112 (one shown) and one or more capacitors 114 (one shown). Additional capacitors 116 may be positioned on (again, in the Y-axis direction) the backplane 102 and may be coupled to power planes 118 within the backplane 102. An IC package 120 is coupled to the power planes 118 through a contact such as a solder bump 122. More detail about IC packages that include an interposer layer having interconnect structures, where a first interconnect structure has vias of a first pitch and a second interconnect structure has vias of a second pitch greater than the first pitch is provided below beginning with reference to FIG. 2. The IC package 120 may include a die 124 surrounded by a mold material 126. A substrate 128 may be positioned on top of (again in the Y-axis direction) the mold material 126. An additional device or component 130 such as an LPDDR memory element may be positioned on an upper exterior surface of the mold material 126 or the substrate 128. In addition to power signals, data signals and the like may also pass between components on the backplane 102 using metal lines within the backplane 102 and metallization layers within the components. Likewise, signals may pass from the die 124 to the component 130 through metallization layers 132, vias 134, and a ball grid array (BGA) 136. While specific structures are shown on the backplane 102, it should be appreciated that many variations are possible.

Conventionally, in place of the vias 134 in the IC package 120 in FIG. 1, conductive pillars or pins may be used. For example, if the component 130 was an LPDDR memory element, such component might have approximately, but generally fewer than, 700 input/output (I/O) contacts served by the BGA 136. The BGA 136 in turn was connected to pins that extended through the substrate 128 and the mold material 126 to the metallization layers 132. Given the number of contacts, such pins were readily manufactured. However, recent trends towards high-bandwidth memory (HBM) devices contemplate a component having more than 3,000 I/O contacts on a component 130 as an example. Use of pins in the conventional manner results in one of two possible, but equally undesirable results. The pins are crowded to the point where there are electrical shorts therebetween causing signal corruption, or the size of the package is increased to allow adequate spacing between the pins. On one hand, the component is effectively useless since the signal corruption precludes reliability. On the other hand, as the size of the package increases, the cost increases, and such larger size may force other design compromises in a computing device incorporating such a package. Larger packages may also have thermal issues or have other undesirable characteristics.

Figure 2:
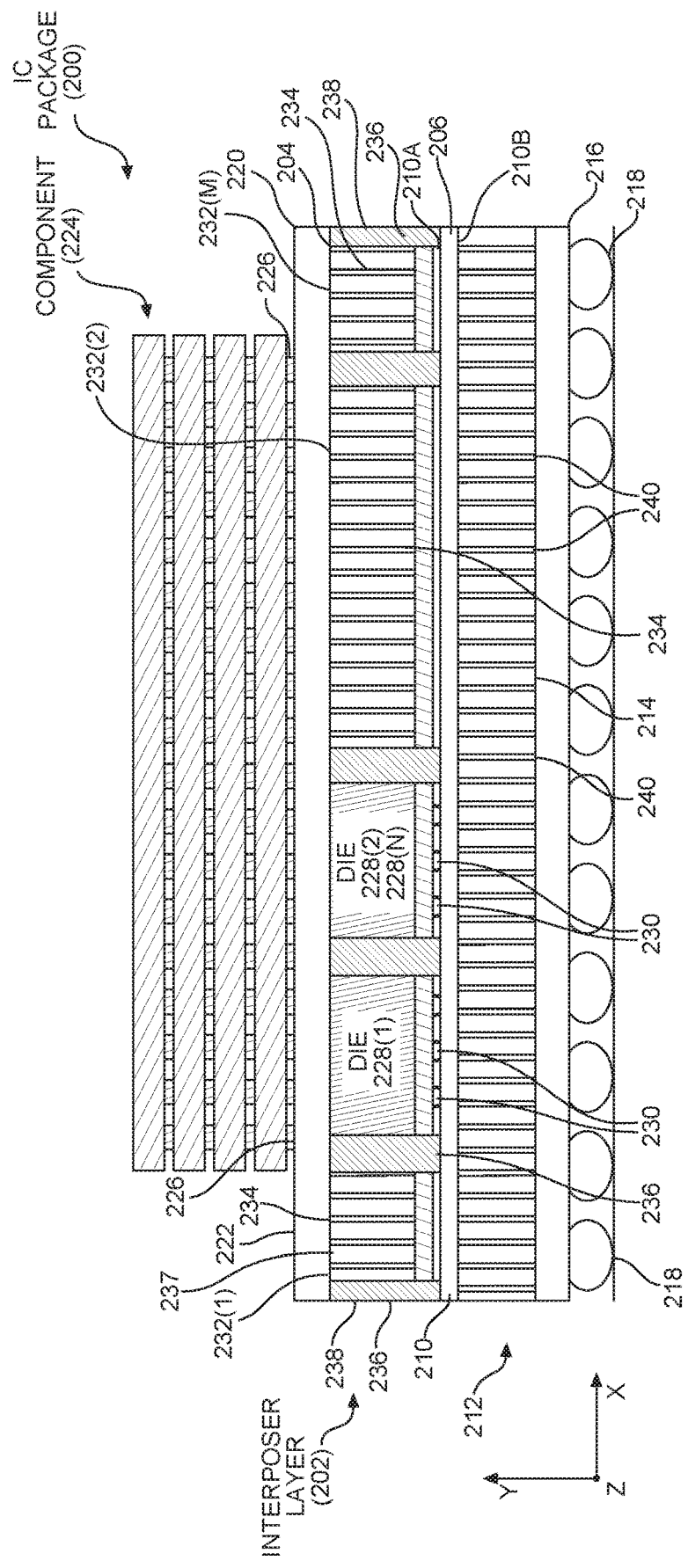
FIG. 2 is a side elevational view of a package with a memory device positioned on an upper exterior surface and an interposer layer according to an exemplary aspect of the present disclosure.

Accordingly, FIG. 2 provides an example of an IC package 200 that includes an interposer layer 202, which has interconnect structures, where a first interconnect structure has vias of a first pitch and a second interconnect structure has vias of a second pitch greater than the first pitch. The interposer layer 202 acts as a device that can allow conductive coupling for other devices with those pitches to support interconnections between those devices and other devices within the interposer layer 202. More specifically, the interposer layer 202 is assembled from singulated IC dies and modular interconnect structures. In particular, a via density (which is a function of via pitch) may be selected based on package requirements. Thus, for example, an IC package with an LPDDR memory component may have an interconnect structure with a relatively large pitch (i.e., low density) while an IC package with an HBM memory component may have an interconnect structure with a relatively small pitch (i.e., high density). Further, where there are plural interconnect structures, via density may be varied between the different interconnect structures to balance connection requirements against cost and space.

In an exemplary aspect, the vias of the interconnect structures are through silicon vias (TSVs). In another exemplary aspect, the vias of the interconnect structures are fashioned as monolithic inter-tier vias (MIVs) as explained in *Monolithic 3D IC vs. TSV-based 3DIC in 14 nm FinFET Technology*, by Sandeep Samal et al., available at www.gt-cad.gatech.edu/www/papers/07804405.pdf.

In this regard, FIG. 2 shows a cross-sectional side elevational view of an IC package 200 (e.g., analogous to the package 120 of FIG. 1) that includes an interposer layer 202, which may be a reconstituted multi-die silicon (Si) interposer layer as described herein. The interposer layer 202 has a first side 204 that exists on a first plane (i.e., in the X-Z plane according to the X and Z axes in FIG. 2) and a second side 206 that exists on a second plane that is parallel to the first plane. For ease of reference, the first side 204 is sometimes referred to as a "top side 204" and the second side 206 as a "bottom side 206" in view of their respective positions on the Y-axis relative to a PCB 208. In this context, the first side 204 is on a side of the interposer layer 202 opposite that of the second side 206. A metallization layer 210 is adjacent to the second side 206 (i.e., the second side 206 is positioned on top of the metallization layer 210) and may have a first side 210A and a second side 210B. A second interposer layer 212 is positioned beneath the metallization layer 210 (i.e., the metallization layer 210 is positioned on top of the second interposer layer 212 such that the second side 210B is adjacent to the second interposer layer 212). The second interposer layer 212 may include a bottom side 214, which is positioned on top of external package layer 216. External package layer 216 may include or be coupled to package interconnects 218 that electrically couple the IC package 200 to conductive elements (not shown) in the PCB 208. In an exemplary aspect, the package interconnects 218 may be solder bumps, copper posts, a BGA, or the like as is well understood. It should be appreciated that conductive material (not shown) may extend through the external package layer 216 to couple the package interconnects 218 to the second interposer layer 212.

A second external package layer 220 may be positioned on top of the interposer layer 202, for example, on top of, in the Y axis, the first side 204 of the interposer layer 202. The second external package layer 220 may have a top side 222. A component 224 may be positioned on the top side 222 and may be coupled to electrical conductors (not shown) in the external package layer 220 by package interconnects 226. In an exemplary aspect, the component 224 may be a memory element such as an LPDDR memory element or an HBM memory element. Exemplary aspects of the present disclosure are well suited for components having a large number of package interconnects 226 (sometimes referred to as input/outputs (I/Os)), and may for example readily work with components having an I/O count above two or three thousand as is common for HBM memory elements. However, the present disclosure works well with older technologies such as LPDDR, which may have I/O counts around 700.

The interposer layer 202 may include one or more dies 228(1)-228(N), where as shown, N=2 in this example. Individual die 228(1) may be fabricated using a different technology than individual die 228(2). For example, the individual die 228(1) may be fabricated using a four or five nanometer (4 or 5 nm) technology, and the individual die 228(2) may be fabricated using a fourteen (14) nm technology (or 10 and 14, 14 and 22; etc.). The dies 228(1)-228(N) may be coupled to the metallization layer 210 through die interconnects 230. By accommodating different technologies for different dies 228(1)-228(N), the interposer layer 202 may have greater flexibility in terms of making design choices.

To further improve the flexibility of the interposer layer 202, the interposer layer 202 may further include one or more interconnect structures 232(1)-232(M) (sometimes just referred to as a silicon (Si) interposer), where as illustrated M=3. As explained more below, a first interconnect structure 232(1) has vias 234 of a first pitch, and a second interconnect structure 232(2) has vias 234 of a second pitch greater than the first pitch. In this manner, the interposer layer 202 allows conductive coupling between other devices that may have different connection requirements. It should be appreciated that all the interconnect structures 232(1)-232(M) may include vias 234. In an exemplary aspect, the vias 234 are TSVs. In an alternate exemplary aspect, the vias are MIVs. When there are a plurality of interconnect structures 232 (1)-232(M), different ones of the interconnect structures 232(1)-232(M) may be made using different technologies and have different line width/spacing (L/S) values. As used herein, the line width is the diameter of a given via, and the spacing is the edge-to-edge spacing of the vias. The combination of the "line width" and the "spacing" results in what is commonly referred to as a "pitch." In an exemplary aspect, the vias 234 of a first interconnect structure 232(1) have an L/S value of 0.7/0.7 micrometers (μm). Such a low L/S value provides vias 234 in sufficient density to accommodate connections to the 2,000-3,000 component interconnects 226 of the component 224. Other interconnect structures 232(2)-232(M) may have different (e.g., larger) L/S values corresponding to less-densely-placed vias 234. It should be appreciated that the less dense (larger L/S values) interconnect structures 232(2)-232(M) may be less expensive to fabricate.

Dies 228(1)-228(N) and interconnect structures 232(1)-232(M) are separated from each other and from one another by a mold material 236. Some mold material 236 may be positioned at exterior edges 238 of the IC package 200.

The second interposer layer 212 may include vias 240 that are uniformly distributed (e.g., all have the same L/S value) or may be a composite of multiple interconnect structures (not shown) having different L/S values. The vias 240 may be coupled to conductive elements within the metallization layer 210 and the package interconnects 218 as is well understood.

Electrical connections may be formed between the component 224 and dies 228(1)-228(N) through the component interconnects 230 coupling to the vias 234 in one of the interconnect structures 232(1)-232(M) through the second external package layer 220, down to the metallization layer 210, and back through the die interconnects 230. Likewise, the component 224 may be coupled to the package interconnects 218 through the component interconnects 230 coupling to the vias 234 in one of the interconnect structures 232(1)-232(M) through the second external package layer 220, down to the metallization layer 210, and then down through the second interposer layer 212 to the package interconnects 218.

Figure 3:
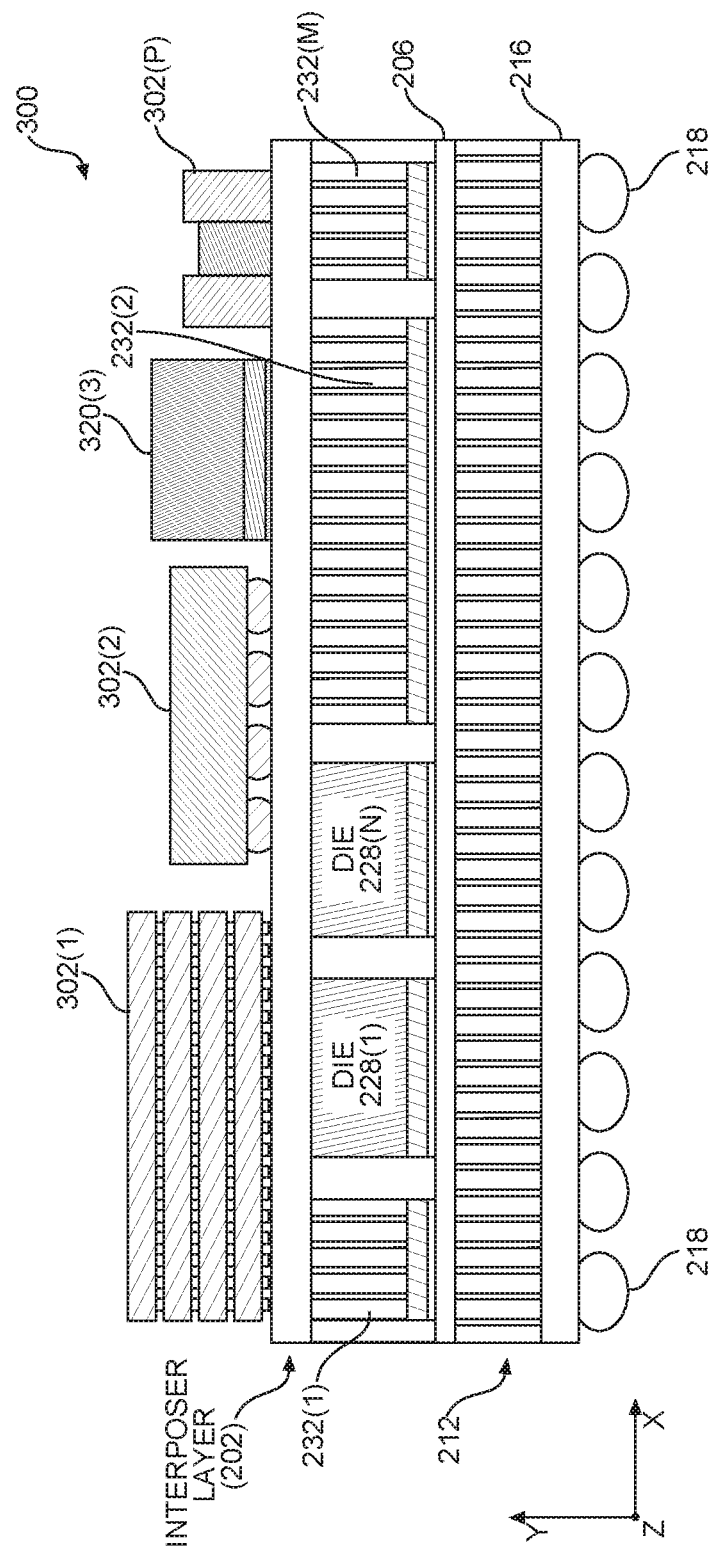
FIG. 3 is a side elevational view of a package with a plurality of components positioned on an upper exterior surface and an interposer layer according to an exemplary aspect of the present disclosure.

While a single component 224 is illustrated in the IC package 200 of FIG. 2, the present disclosure is not so limited, and an IC package 300 as illustrated in FIG. 3 may include multiple components 302(1)-302(P) positioned above the interposer layer 202. Different ones of the components 302(1)-302(P) may be coupled to different interconnect structures 232(1)-232(M) in the interposer layer 202 (e.g., M may equal P). Alternatively, multiple ones of the components 302(1)-302(P) may be coupled to the same interconnect structure 232. For example, components 302(2) and 302(3) may both connect to the interconnect structure 232(2). The type of component within the multiple components 302(1)-302(P) is diverse. In an exemplary aspect, the component 302(1) may be a memory component such as an HBM memory element. The component 302(2) may be another package. The component 302(3) may be a die. The component 302(P) may be a surface mount device (SMD). Different ones of the components 302(1)-302(P) may be the same type of component (e.g., 302(1)-302(2) may both be memory elements and 302(3)-302(P) may be packages, or all the components could be memory elements) without departing from the scope of the present disclosure.

Figure 4:
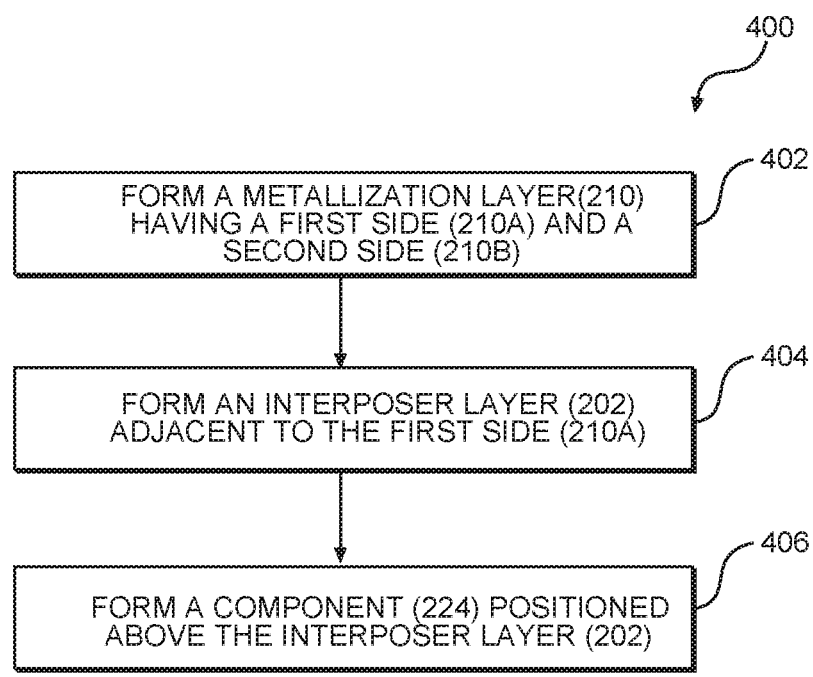
FIG. 4 is a flowchart illustrating an exemplary process for fabricating a package having an interposer layer like the packages of FIGS. 2 and 3.

A method of fabricating the IC package 200 (or the IC package 300) is provided by reference to a process 400 illustrated in FIG. 4. In this regard, the process 400 begins by forming the metallization layer 210 having the first side 210A and the second side 210B (block 402). The process 400 continues by forming the interposer layer 202 adjacent to the first side 210A of the metallization layer 210 (block 404), where as described above, the interposer layer 202 includes at least a die 228(1), a first interconnect structure 232(1) having a first plurality of vias 234 having a first U/S value, and a second interconnect structure 232(2) having a second plurality of vias 234 having a second L/S value, wherein the second L/S value is greater than the first L/S value. Forming the interposer layer 202 may further include forming a second die 228(2) and forming a mold material 236 between the die 228(1) and the interconnect structure 232(1). The process 400 further includes forming a component 224 positioned above the interposer layer 202 (block 406) and connected to the die 228(1) through the first interconnect structure 232(1). The component 224 is attached to the package layer 220 above the interposer layer 202 and may be a memory component.

Figure 5A:
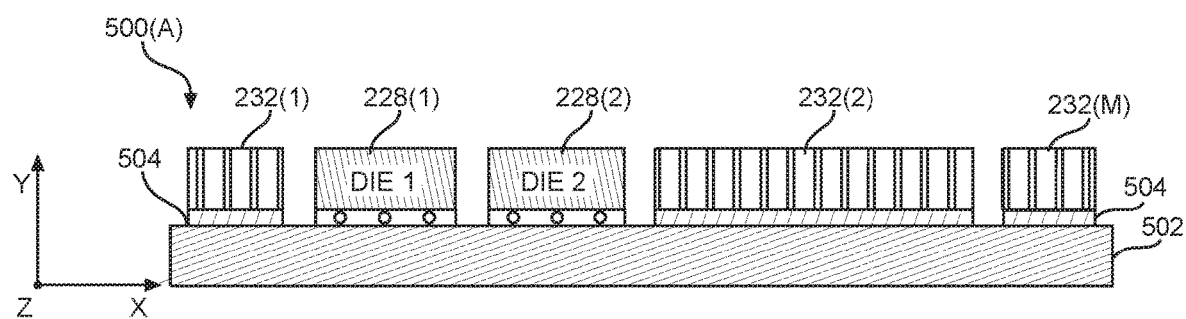
FIGS. 5A-5H illustrate side elevational views of fabrication stages of the process of FIG. 4.

While the process 400 is accurate, it is also provided at a relatively high level of abstraction. A more complete discussion of the fabrication is provided with reference to FIGS. 5A-5H where intermediate fabrication products are illustrated. In this regard, FIG. 5A illustrates an initial fabrication product 500A of the interposer layer 202 where dies 228(1) and 228(2) are placed on a dummy carrier 502 (e.g., above with reference to the Y axis) with an adhesive 504. Likewise, the interconnect structures 232(1)-232(M) are placed on the dummy carrier 502 with the adhesive 504. The dummy carrier 502 may be a silicon wafer or the like. The adhesive 504 may be any sort of temporary bonding film used in the semiconductor industry.

Figure 5B:
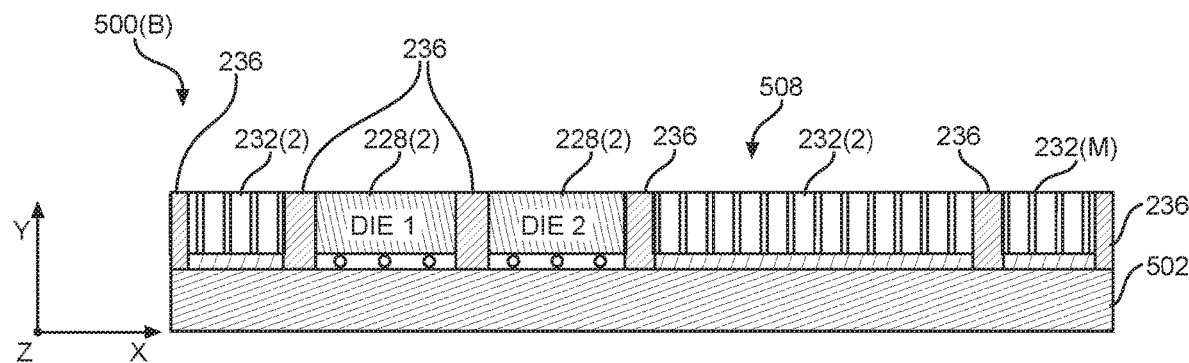

After forming the fabrication product 500A, a mold material such as the mold material 236 is formed between the dies 228(1)-228(N) and the interconnect structures 232(1)-232(M) before being ground or polished to a flat upper surface 508 as illustrated by fabrication product 500B of FIG. 5B. The grinding or polishing may be through a chemical mechanical polish (CMP) or the like.

Figure 5C:
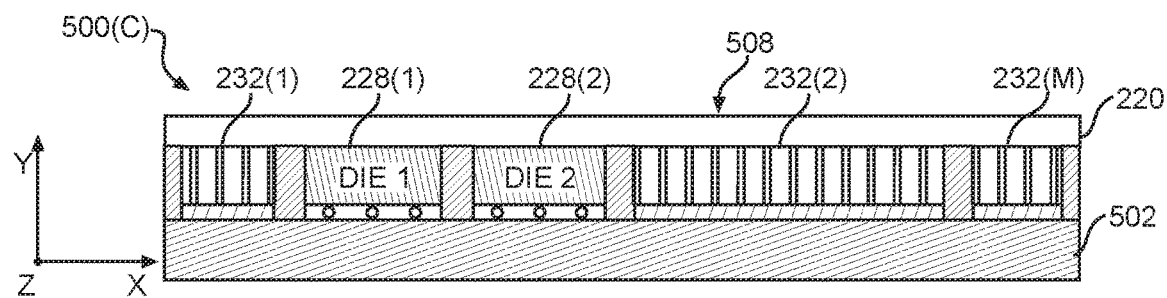

After removing the mold material from the top of the dies 228(1)-228(N) and the interconnect structures 232(1)-232(M), back side package layers 220 are formed as illustrated in fabrication product 500C of FIG. 5C. The back side package layers 220 may include a redistribution layer (RDL) using coats and masks with appropriate etching as is well known in the semiconductor industry. The back side package layers 220 include conductors to allow electrical connections therethrough.

Figure 5D:
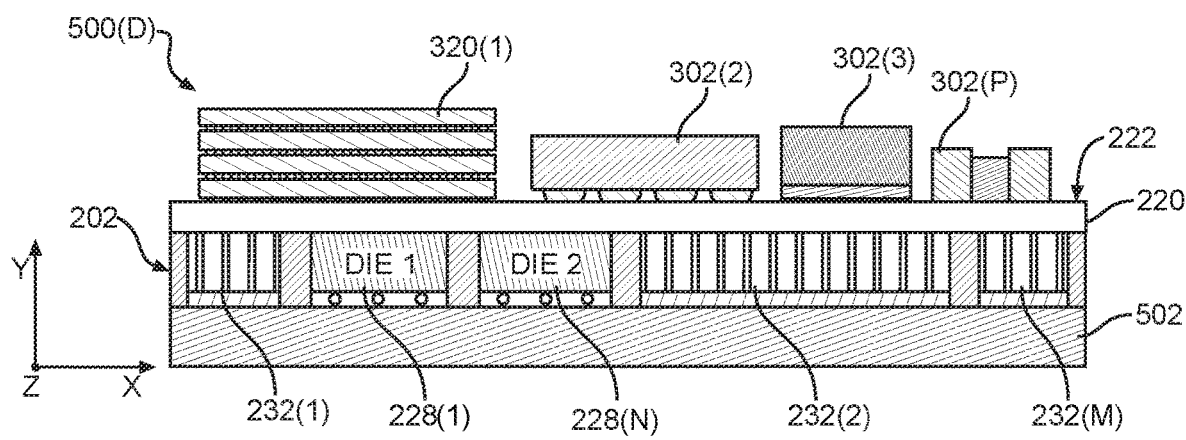

Components 224 or 302(1)-302(P) are then attached on an upper surface 222 of the back side package layer 220 as illustrated by fabrication product 500D of FIG. 5D. Appropriate connections are formed from component interconnects through the conductors of the package layer 220 to the interconnect structures 232(1)-232(M) of the interposer layer 202.

Figure 5E:
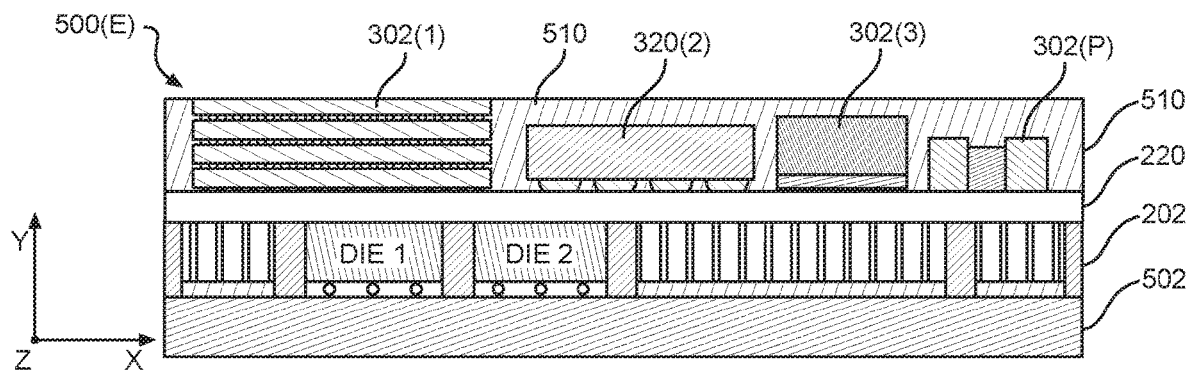

Additional mold material 510 may be used to encapsulate the components 302(1)-302(P) as shown in fabrication product 500E shown in FIG. 5E. Note that this step is optional.

Figure 5F:
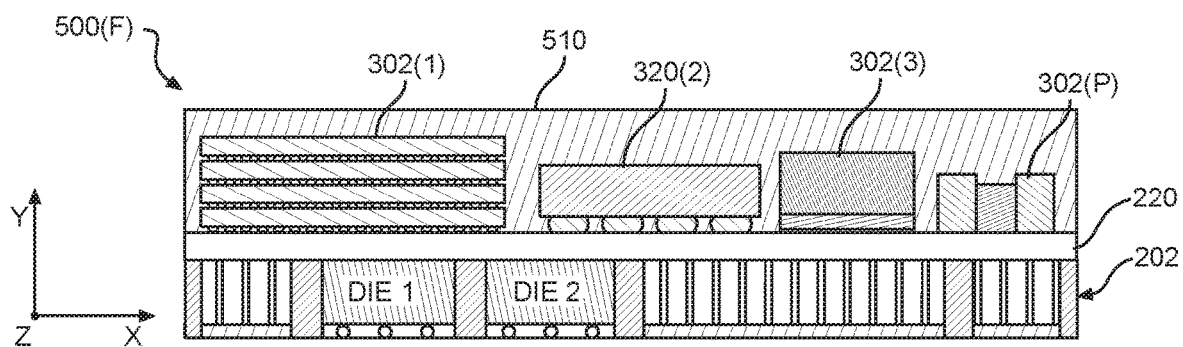

At this point, the dummy carrier 502 is removed to create fabrication product 500F illustrated in FIG. 5F. The fabrication product 500F includes the interposer layer 202, the package layer 220, and the components 302(1)-302(P) (or maybe just component 224).

Figure 5G:
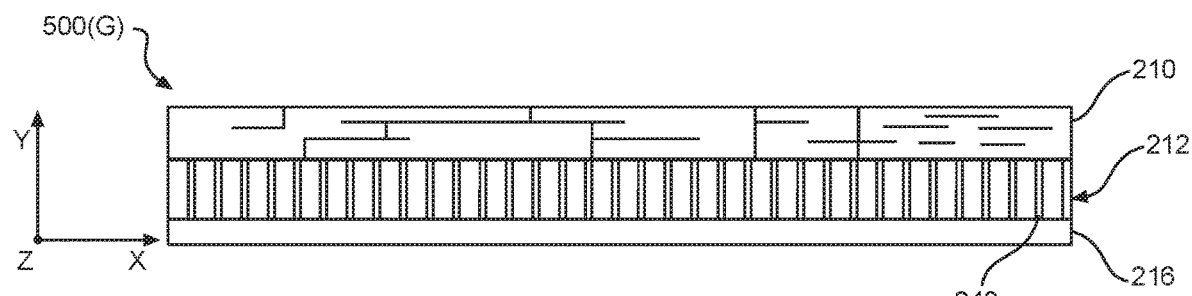

Separately (and perhaps concurrently), a second half of the IC package 300 (or 200) is formed. Specifically, a fabrication stage 500G as illustrated in FIG. 5G is formed from a second interposer layer 212 having a package layer 216 formed thereon. The package layer 216 may be an RDL or the like. The second interposer layer 238 may have vias 240 therein as previously described.

Figure 5H:
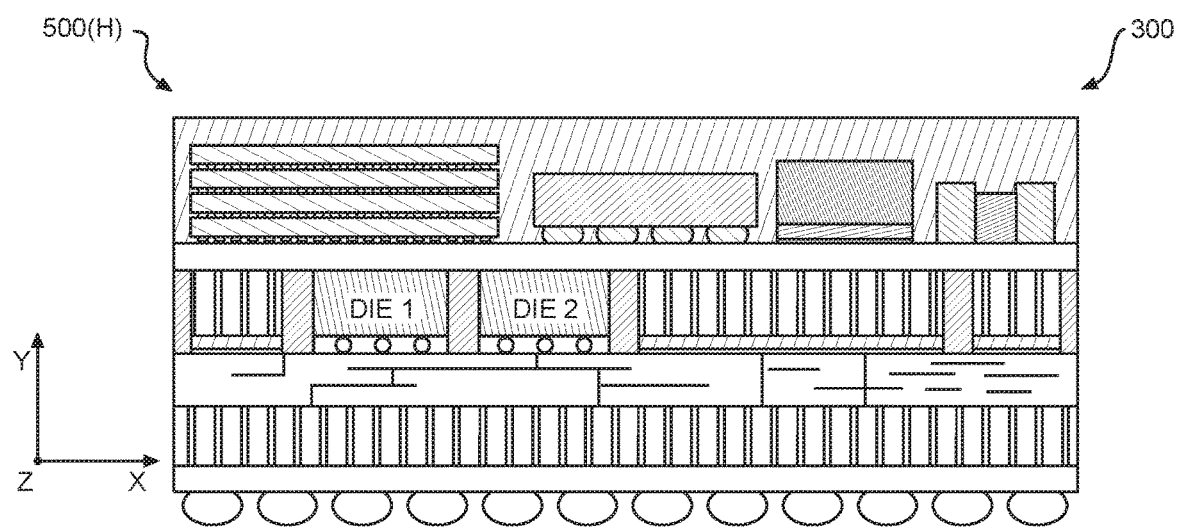

The fabrication product 500G is bonded to the fabrication product 500F to form the IC package 300 as illustrated in FIG. 5H.

Note that "top" and "bottom" where used herein are relative terms and are not meant to limit or imply a strict orientation that a "top" referenced element must always be oriented to be above a "bottom" referenced element, and vice versa.

The devices with a reconstituted die interposer layer for improved connectivity according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
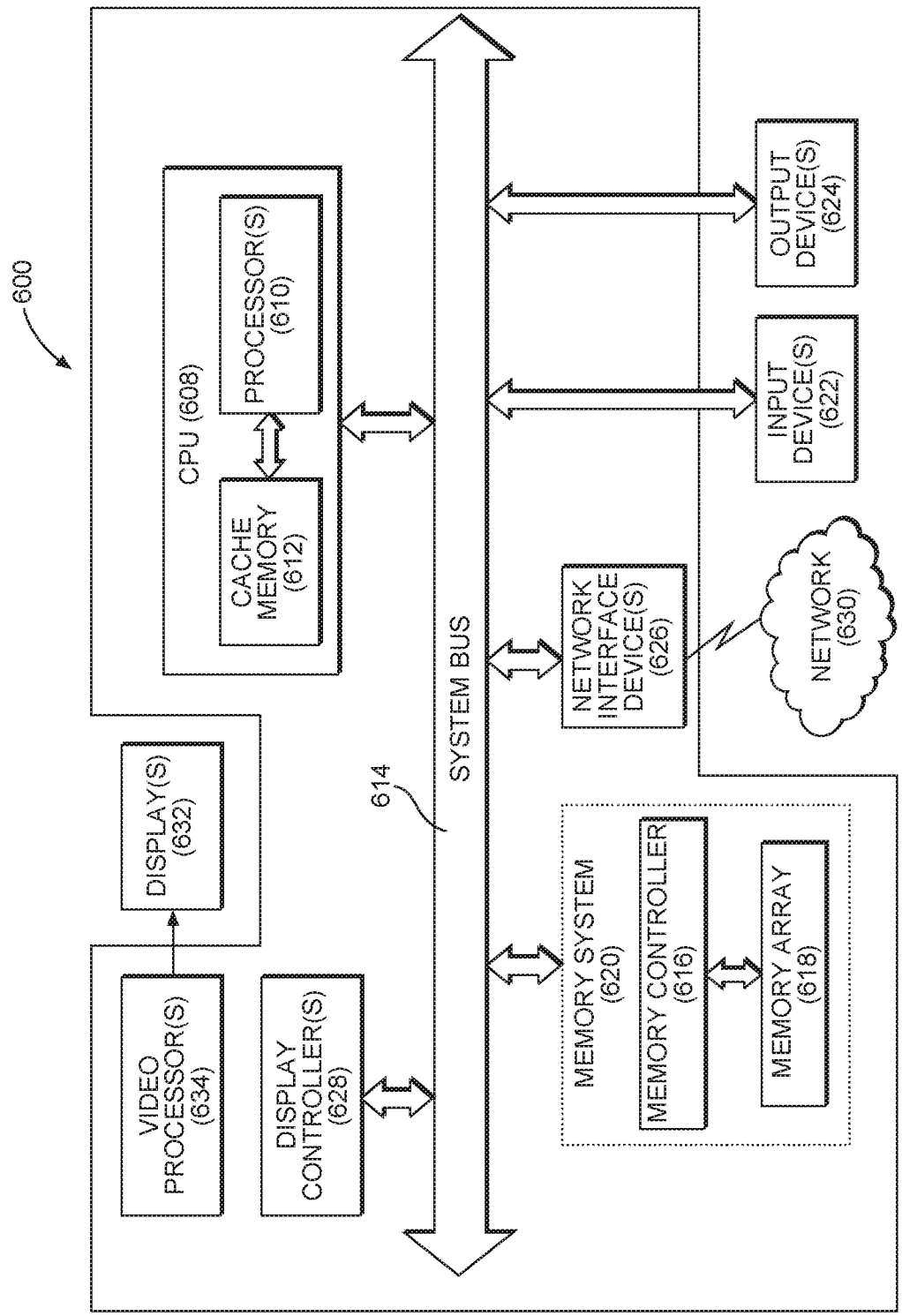
FIG. 6 is a block diagram of an exemplary processor-based system that can include the packages of FIGS. 2 and 3.

More generally, in this regard, FIG. 6 illustrates an example of a processor-based system 600 that can employ the IC packages illustrated in FIGS. 2 and 3. In this example, the processor-based system 600 includes one or more central processing units (CPUs) 608, each including one or more processors 610. The CPU(s) 608 may have cache memory 612 coupled to the processor(s) 610 for rapid access to temporarily stored data. The CPU(s) 608 is coupled to a system bus 614 and can intercouple master and slave devices included in the processor-based system 600. As is well known, the CPU(s) 608 communicates with these other devices by exchanging address, control, and data information over the system bus 614. For example, the CPU(s) 608 can communicate bus transaction requests to a memory controller 616 as an example of a slave device.

Other master and slave devices can be connected to the system bus 614. As illustrated in FIG. 6, these devices can include a memory system 620, one or more input devices 622, one or more output devices 624, one or more network interface devices 626, and one or more display controllers 628, as examples. The input device(s) 622 can include any type of input device, including, but not limited to, input keys, switches, voice processors, etc. The output device(s) 624 can include any type of output device, including, but not limited to, audio, video, other visual indicators, etc. The network interface device(s) 626 can be any devices configured to allow exchange of data to and from a network 630. The network 630 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 626 can be configured to support any type of communications protocol desired. The memory system 620 can include a memory array 618.

The CPU(s) 608 may also be configured to access the display controller(s) 628 over the system bus 614 to control information sent to one or more displays 632. The display controller(s) 628 sends information to the display(s) 632 to be displayed via one or more video processors 634, which process the information to be displayed into a format suitable for the display(s) 632. The display(s) 632 can include any type of display, including, but not limited to, a cathode ray tube (CRT), a liquid crystal display (LCD), a plasma display, a light emitting diode (LED) display, etc.

Figure 7:
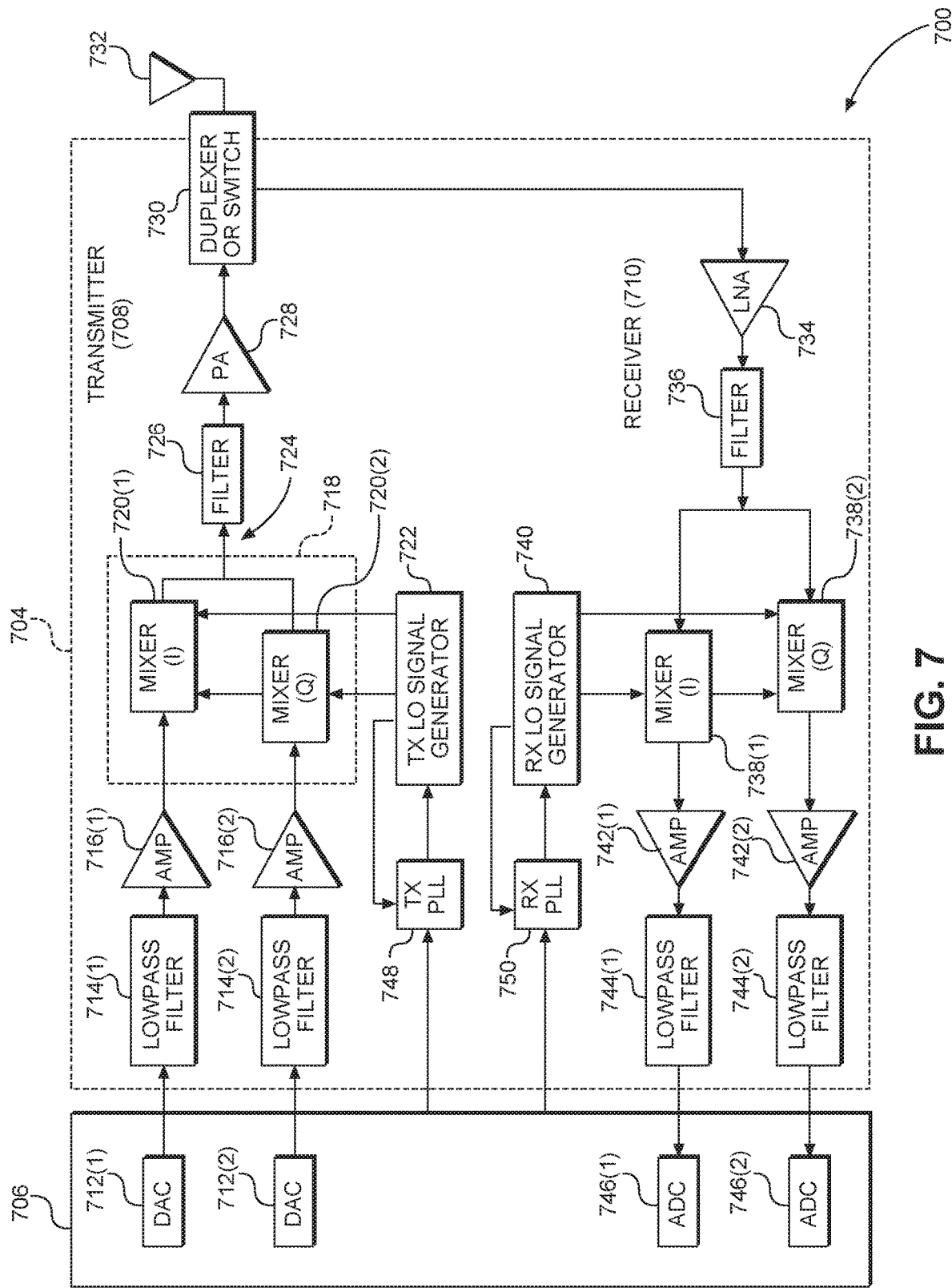
FIG. 7 is a block diagram of a wireless transceiver that can include the packages of FIGS. 2 and 3.

FIG. 7 illustrates an example of a wireless communications device 700 which can include the IC packages of FIGS. 2 and 3. The wireless communications device 700 may include or be provided in any of the above-referenced devices, as examples. As shown in FIG. 7, the wireless communications device 700 includes a transceiver 704 and a data processor 706. The data processor 706 may include a memory (not shown) to store data and program codes. The transceiver 704 includes a transmitter 708 and a receiver 710 that support bi-directional communication. In general, the wireless communications device 700 may include any number of transmitters and/or receivers for any number of communication systems and frequency bands. All or a portion of the transceiver 704 may be implemented on one or more analog ICs, RF ICs (RFICs), mixed-signal ICs, etc.

A transmitter 708 or a receiver 710 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 710. In the direct-conversion architecture, a signal is frequency converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog-converters (DACs) 712(1) and 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired images caused by the prior digital-to-analog conversion. Amplifiers (AMPs) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired images caused by the frequency upconversion as well as noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific RX-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix an output of the filter 736 with I and Q receive (RX) LO signals (i.e., LO_I and LO_Q) from an RX LO signal generator 740 to generate I and Q baseband signals. The I and Q baseband signals are amplified by AMPs 742(1), 742(2) and further filtered by lowpass filters 744(1), 744(2) to obtain I and Q analog input signals, which are provided to the data processor 706. In this example, the data processor 706 includes analog-to-digital-converters (ADCs) 746(1), 746(2) for converting the analog input signals into digital signals to be further processed by the data processor 706.

In the wireless communications device 700 in FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A transmit (TX) phase-locked loop (PLL) circuit 748 receives timing information from data processor 706 and generates a control signal used to adjust the frequency and/or phase of the TX LO signals from the TX LO signal generator 722. Similarly, a receive (RX) phase-locked loop (PLL) circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) package, comprising:
   an interposer layer comprising:
   a first modular interconnect structure comprising a first plurality of vias having a first pitch configured to couple to a high-bandwidth memory component comprising over two thousand input/outputs (I/Os);
   a second modular interconnect structure comprising a second plurality of vias having a second pitch greater than the first pitch configured to be coupled to a second component comprising a low speed memory component; and
   a mold material positioned between the first modular interconnect structure and the second modular interconnect structure.

2. The IC package of claim 1, further comprising the high-bandwidth memory component adjacent to the interposer layer and coupled to the first modular interconnect structure.

3. The IC package of claim 2, wherein the two thousand input/outputs (I/Os) are coupled to the first modular interconnect structure.

4. The IC package of claim 2, further comprising the second component positioned above the interposer layer.

5. The IC package of claim 1, wherein the interposer layer comprises a die.

6. The IC package of claim 1, further comprising a second interposer layer comprising a third interconnect structure.

7. The IC package of claim 6, wherein the third interconnect structure comprises a third pitch different than the first pitch.

8. The IC package of claim 1, wherein the first pitch comprises a line width/spacing value (L/S value) and the L/S value is less than or approximately equal to 0.7/0.7 micrometers (μm).

9. The IC package of claim 2, wherein:
   the interposer layer comprises a die; and
   the high-bandwidth memory component is coupled to the die through the first modular interconnect structure.

10. The IC package of claim 1, wherein the first plurality of vias comprise through silicon vias (TSVs).

11. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. The IC package of claim 1, further comprising the second component adjacent to the interposer layer.

13. The IC package of claim 1, wherein the interposer layer comprises a first IC die and a second IC die.

14. The IC package of claim 1, further comprising a metallization layer and a second interposer layer comprising a third interconnect structure, the second interposer layer positioned adjacent to the metallization layer.

15. The IC package of claim 14, wherein the third interconnect structure comprises a third line width/space (L/S) value different than a first L/S value.

16. The IC package of claim 1, further comprising additional mold material positioned between at least one IC die and the first modular interconnect structure.

17. A method of fabricating an integrated circuit (IC) package, comprising:
   forming a metallization layer comprising a first side and a second side;
   forming an interposer layer adjacent to the first side of the metallization layer, the interposer layer comprising:
   at least one IC die;
   a first modular interconnect structure comprising a first plurality of vias having a first pitch configured to be coupled to a high-bandwidth memory component;
   a second modular interconnect structure comprising a second plurality of vias having a second pitch, wherein the second pitch is greater than the first pitch; and
   a mold material positioned between the first modular interconnect structure and the second modular interconnect structure; and
   forming the high-bandwidth memory component adjacent to the interposer layer and coupled to the at least one IC die through the first modular interconnect structure.

18. The method of claim 17, wherein forming the interposer layer further comprises forming a second IC die in the interposer layer.

19. The method of claim 17, wherein forming the interposer layer further comprises forming additional mold material between the at least one IC die and the first modular interconnect structure.

20. The method of claim 17, further comprising attaching the high-bandwidth memory component to a package layer above the interposer layer.

* * * * *